United States Patent
Zuo

(10) Patent No.: US 10,701,817 B2
(45) Date of Patent: Jun. 30, 2020

(54) ELECTRONIC DEVICE AND METHOD FOR CONTROLLING DISPLAY OF ELECTRONIC DEVICE

(71) Applicant: Guangdong Oppo Mobile Telecommunications Corp., Ltd., Dongguan, Guangdong (CN)

(72) Inventor: Zhouquan Zuo, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/414,420

(22) Filed: May 16, 2019

(65) Prior Publication Data
US 2020/0022268 A1    Jan. 16, 2020

(30) Foreign Application Priority Data

Jul. 16, 2018 (CN) ............................ 2018 1 0780720
Jul. 16, 2018 (CN) ...................... 2018 2 1127074 U

(51) Int. Cl.
*H05K 5/00* (2006.01)
*G02F 1/1333* (2006.01)
(Continued)

(52) U.S. Cl.
CPC ..... *H05K 5/0017* (2013.01); *G02F 1/133305* (2013.01); *G09G 5/14* (2013.01);
(Continued)

(58) Field of Classification Search
CPC ...... H05K 5/0017; H05K 5/0217; H05K 5/03; G02F 1/133305; G02F 2203/01; G09G 5/14; G09G 2380/02
See application file for complete search history.

(56) References Cited

U.S. PATENT DOCUMENTS 6,671,011 B1    12/2003 Zhang et al.
7,639,237 B2 *  12/2009 Perkins .................. G06F 1/1615
                                                              345/156
(Continued)

FOREIGN PATENT DOCUMENTS

CN      101163163 A    4/2008
CN      203721163 U    7/2014
(Continued)

OTHER PUBLICATIONS

International search report issued in corresponding international application No. PCT/CN2019/088162 dated Aug. 22, 2019.
(Continued)

*Primary Examiner* — Michael Pervan
(74) *Attorney, Agent, or Firm* — Young Basile Hanlon & MacFarlane, P.C.

(57) ABSTRACT

A method for controlling display and an electronic device are provided. The electronic device includes a housing, a rotatable mechanism, a driving mechanism, and a flexible display screen. The flexible display screen is wound on and connected to the rotatable mechanism. The housing has a light transmitting region, and part of the flexible display screen facing the light transmitting region forms a first display area of the electronic device. In response to different control signals, the controller controls the driving mechanism to rotate the rotatable mechanism in different directions to control retraction and stretching of the flexible display screen. According to a length of part of the flexible display screen extending out of the housing, the controller controls display of the first display area and a second display area of the flexible display screen extending out of the housing.

16 Claims, 5 Drawing Sheets

(51) Int. Cl.
*G09G 5/14* (2006.01)
*H05K 5/02* (2006.01)
*H05K 5/03* (2006.01)

(52) U.S. Cl.
CPC ............ *H05K 5/0217* (2013.01); *H05K 5/03* (2013.01); *G02F 2203/01* (2013.01); *G09G 2380/02* (2013.01)

(56) References Cited

U.S. PATENT DOCUMENTS

| | | |
|---|---|---|
| 2015/0340004 A1 | 11/2015 | Pang |
| 2016/0034000 A1 | 2/2016 | Lee et al. |
| 2017/0196102 A1 | 7/2017 | Shin et al. |
| 2017/0212607 A1 | 7/2017 | Yoon |

FOREIGN PATENT DOCUMENTS

| | | |
|---|---|---|
| CN | 105204800 A | 12/2015 |
| CN | 106205390 A | 12/2016 |
| CN | 107993573 A | 5/2018 |
| EP | 3480802 A1 | 5/2019 |

OTHER PUBLICATIONS

Extended European search report issued in corresponding European application No. 19176201.2 dated Oct. 9, 2019.

\* cited by examiner

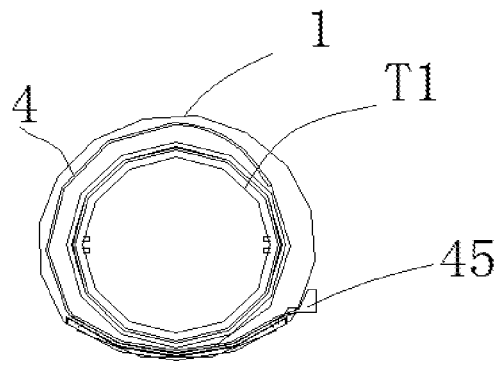

FIG. 7

```
Controlling, in response to a control signal for
retracting, a driving mechanism of an electronic device
to rotate a rotatable mechanism of the electronic device
in a first direction to retract a flexible display screen of      81
the electronic device into a housing of the electronic
device, and controlling, in response to a control signal
for stretching, the driving mechanism to rotate the
rotatable mechanism in a second direction opposite the
first direction to stretch the flexible display screen out
of the housing
```

```
Controlling, according to a length of part of the              83
flexible display screen extending out of the housing,
display of the first display area and a second display
area of the flexible display screen extending out of the
housing when the electronic device implements display
```

FIG. 8

ELECTRONIC DEVICE AND METHOD FOR CONTROLLING DISPLAY OF ELECTRONIC DEVICE

CROSS-REFERENCE TO RELATED APPLICATION(S)

The present disclosure claims priority to Chinese Patent Application No. 201821127074.1, filed on Jul. 16, 2018, and Chinese Patent Application No. 201810780720.2, filed on Jul. 16, 2018, the entire disclosures of both of which are hereby incorporated by reference.

TECHNICAL FIELD

The present disclosure relates to the field of electronic devices, and particularly to an electronic device and a method for controlling display of an electronic device.

BACKGROUND

At present, electronic devices such as mobile phones, tablet computers and the like are widely used. Electronic devices having a large screen become popular among users. For the existing electronic device having the large screen, the electronic device as a whole also has a large size. For consideration of requirements for portability and convenience for holding, the size of the screen of the existing electronic device is limited.

SUMMARY

The present disclosure aims to provide an electronic device and a method for controlling display of the electronic device.

According to a first aspect of the present disclosure, an electronic device is provided. The electronic device includes a housing, a rotatable mechanism, a driving mechanism, a flexible display screen, and a controller. The rotatable mechanism and the driving mechanism are received in the housing. The flexible display screen is wound on and connected to the rotatable mechanism. The driving mechanism is connected to the rotatable mechanism to rotate the rotatable mechanism. The controller is electrically coupled to the driving mechanism, and configured to control, in response to a control signal for retracting, the driving mechanism to rotate the rotatable mechanism in a first direction to retract the flexible display screen into the housing, and to control, in response to a control signal for stretching, the driving mechanism to rotate the rotatable mechanism in a second direction opposite the first direction to stretch the flexible display screen out of the housing. The housing has a light transmitting region. Part of the flexible display screen facing the light transmitting region forms a first display area of the electronic device. Part of the flexible display screen extending out of the housing forms a second display area of the electronic device. The controller is further configured to control, according to a length of the part of the flexible display screen extending out of the housing, display of the first display area and the second display area.

According to a second aspect of the present disclosure, another electronic device is provided. The electronic device includes a housing, a rotatable mechanism, a driving mechanism, a flexible display screen, and a controller. The rotatable mechanism and the driving mechanism are received in the housing. The driving mechanism is connected to the rotatable mechanism to rotate the rotatable mechanism. The flexible display screen is wound on and connected to the rotatable mechanism. The controller is electrically coupled to the driving mechanism, and configured to control, in response to a control signal for retracting, the driving mechanism to rotate the rotatable mechanism in a first direction to retract the flexible display screen into the housing, and to control, in response to a control signal for stretching, the driving mechanism to rotate the rotatable mechanism in a second direction to stretch the flexible display screen out of the housing. The controller is further configured to control, according to the retraction and stretching of the flexible display screen, display of first part of the flexible display screen and second part of the flexible display screen extending out of the housing, the first part being received in the housing and visible through the housing when the first part is enabled to implement display.

According to a third aspect of the present disclosure, a method for controlling display is provided. The method is applied to an electronic device. The method for controlling display includes the following. In response to a control signal for retracting, a driving mechanism of the electronic device is controlled to rotate the rotatable mechanism in a first direction to retract a flexible display screen of the electronic device into a housing of the electronic device, and in response to a control signal for stretching, the driving mechanism is controlled to rotate the rotatable mechanism in a second different direction opposite the first direction to stretch the flexible display screen out of the housing. According to a length of part of the flexible display screen extending out of the housing, display of the first display area and a second display area of the flexible display screen extending out of the housing are controlled.

BRIEF DESCRIPTION OF THE DRAWINGS

To illustrate technical solutions of embodiments of the present disclosure clearly, the following descriptions will briefly illustrate the accompanying drawings described in the embodiments. Obviously, the accompanying drawings described in the following are merely some embodiments of the present disclosure. Those skilled in the art can obtain other accompanying drawings according to the described accompanying drawings without creative efforts.

FIG. 7 is a sectional view of the electronic device according to an embodiment of the present disclosure, taken along a direction of movement of a flexible display screen.

FIG. 8 is a flow chart illustrating a method for controlling display according to an embodiment of the present disclosure.

DETAILED DESCRIPTION

Figure 1:
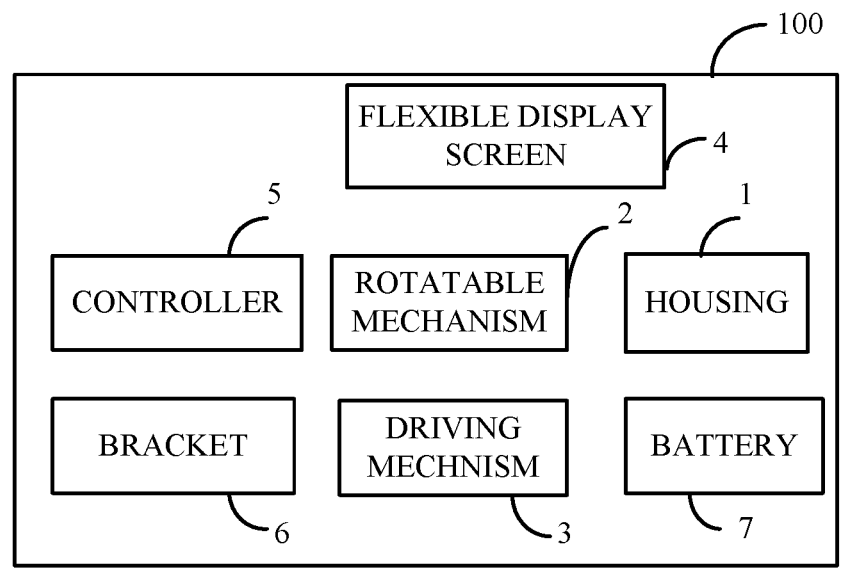
FIG. 1 is a block diagram illustrating an electronic device according to an embodiment of the present disclosure.

Technical solutions of embodiments of the present disclosure will be described clearly and completely in combination with accompanying drawings of the embodiments of the present disclosure. Obviously, the described embodiments are merely part of rather than all embodiments of the present disclosure. Based on the embodiments of the present disclosure, all other embodiments obtained by those skilled in the art without creative efforts shall fall within the protection scope of the present disclosure.

In the description of the embodiments of the present disclosure, it can be understood that the orientation or positional relationship indicated by the term "up", "down", "left", "right", or the like is based on the orientation or positional relationship illustrated in the accompanying drawings, and is merely for convenience of description of the present disclosure and simplified description, rather than implies or indicates that a device or component referred to must have a particular orientation, and must be configured and operated in the particular orientation, and thus is not to be construed as limiting the present disclosure.

In at least one embodiment, an electronic device is provided. The electronic device includes a housing, a rotatable mechanism, a driving mechanism, a flexible display screen, and a controller. The rotatable mechanism and the driving mechanism are received in the housing. The flexible display screen is wound on and connected to the rotatable mechanism. The driving mechanism is connected to the rotatable mechanism to rotate the rotatable mechanism. The controller is electrically coupled to the driving mechanism, and configured to control, in response to a control signal for retracting, the driving mechanism to rotate the rotatable mechanism in a first direction to retract the flexible display screen into the housing, and to control, in response to a control signal for stretching, the driving mechanism to rotate the rotatable mechanism in a second direction opposite the first direction to stretch the flexible display screen out of the housing. The housing has a light transmitting region. Part of the flexible display screen facing the light transmitting region forms a first display area of the electronic device. Part of the flexible display screen extending out of the housing forms a second display area of the electronic device. The controller is further configured to control, according to a length of the part of the flexible display screen extending out of the housing, display of the first display area and the second display area.

In the embodiment, the controller is configured to enable, according to a variation of the length of the part of the flexible display screen extending out of the housing, one of the first display area and the second display area to implement display.

In the embodiment, the controller is configured to enable the first display area to implement display when the length of the part of the flexible display screen extending out of the housing is smaller than a preset length, and to enable the second display area to implement display when the length of the part of the flexible display screen extending out of the housing is larger than or equals the preset length.

In the embodiment, the controller is configured to display, according to the variation of the length of the part of the flexible display screen extending out of the housing, different contents on the first display area and the second display area, respectively.

In the embodiment, the controller is configured to display, when the length of the part of the flexible display screen extending out of the housing is smaller than the preset length, main contents on the first display area and additional contents on the second display area, and to display, when the length of the part of the flexible display screen extending out of the housing is larger than or equals the preset length, the main contents on the second display area and the additional contents on the first display area.

In the embodiment, when the electronic device displays a literature work, the main contents are body contents of the literature work, and the additional contents are comments of the literature work. When the electronic device displays an interface of playing a song, the main contents are lyrics of the song, and the additional contents are introduction of the song.

In the embodiment, the light transmitting region is a transparent cover plate installed in a groove defined on a preset region of the housing.

In the embodiment, the light transmitting region is a cover plate that is installed in a groove defined on a preset region of the housing and transparent after being electrified. The controller is further configured to control, when the part of the flexible display screen facing the preset region is used to implement display, electrification of the preset region to cause the preset region to be the light transmitting region, so as to cause the part of the flexible display screen facing the preset region to be visible.

In the embodiment, the rotatable mechanism is a drum rotatably connected to an end surface of the housing, where the end surface is perpendicular to a longitudinal direction of the drum. The flexible display screen is wound on and connected to an outer wall of the drum. The driving mechanism includes a motor connected to the drum through gear engagement, where the motor is configured to rotate the drum in different directions by changing rotation directions to gradually wind the flexible display screen and retract the flexible display screen into the housing or gradually stretch the flexible display screen out of the housing.

In the embodiment, the drum is hollow. The electronic device further includes a bracket disposed in the drum and fixed to the end surface of the housing, where at least one component is disposed on the bracket, and the at least one component at least includes a battery and the controller.

In the embodiment, the flexible display screen has a first end fixed to the drum, where the first end of the flexible display screen is further electrically coupled to the at least one component through an opening defined on the drum to realize power supply and display control of the flexible display screen.

In the embodiment, the first end of the flexible display screen is electrically coupled to the at least one component through a flexible circuit board having a preset length or a cable having the preset length, where the flexible circuit board or the cable having the preset length is able to maintain an electrical connection between the at least one component disposed on the bracket and the flexible display screen during the rotation of the drum.

In the embodiment, the flexible display screen is provided with an elastic sheet at an edge of the flexible display screen, where the elastic sheet at the edge of the flexible display screen restores to flatten the flexible display screen when the flexible display screen extends out of the housing.

In the embodiment, the elastic sheet is made of metal, and straightened in a natural state.

In the embodiment, the housing is cylindrical.

In the embodiment, the control signal for retracting and the control signal for stretching are generated in response to different input operations.

In at least one embodiment, another electronic device is provided. The electronic device includes a housing, a rotatable mechanism, a driving mechanism, a flexible display screen, and a controller. The rotatable mechanism and the driving mechanism are received in the housing. The driving mechanism is connected to the rotatable mechanism to rotate the rotatable mechanism. The flexible display screen is wound on and connected to the rotatable mechanism. The controller is electrically coupled to the driving mechanism, and configured to control, in response to a control signal for retracting, the driving mechanism to rotate the rotatable mechanism in a first direction to retract the flexible display screen into the housing, and to control, in response to a control signal for stretching, the driving mechanism to rotate the rotatable mechanism in a second direction to stretch the flexible display screen out of the housing. The controller is further configured to control, according to the retraction and stretching of the flexible display screen, display of first part of the flexible display screen and second part of the flexible display screen extending out of the housing, where the first part is received in the housing and visible through the housing when the first part is enabled to implement display.

In at least one embodiment, a method for controlling display is provided. The method is applied to an electronic device. The method includes the following. In response to a control signal for retracting, a driving mechanism of the electronic device is controlled to rotate the rotatable mechanism in a first direction to retract a flexible display screen of the electronic device into a housing of the electronic device, and in response to a control signal for stretching, the driving mechanism is controlled to rotate the rotatable mechanism in a second different direction opposite the first direction to stretch the flexible display screen out of the housing. According to a length of part of the flexible display screen extending out of the housing, display of the first display area and a second display area of the flexible display screen extending out of the housing are controlled.

By means of the electronic device and the method for controlling display of the electronic device in the present disclosure, while ensuring that the whole electronic device is not increased in size and even ensuring that the whole electronic device is decreased in size, a display area of the electronic device is increased in size.

Figure 2:
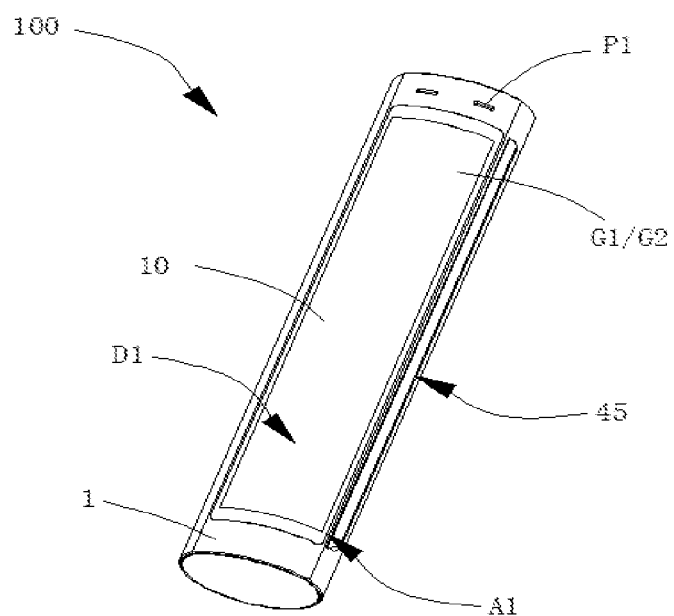
FIG. 2 is a schematic view illustrating the electronic device in a first state according to an embodiment of the present disclosure.
Figure 3:
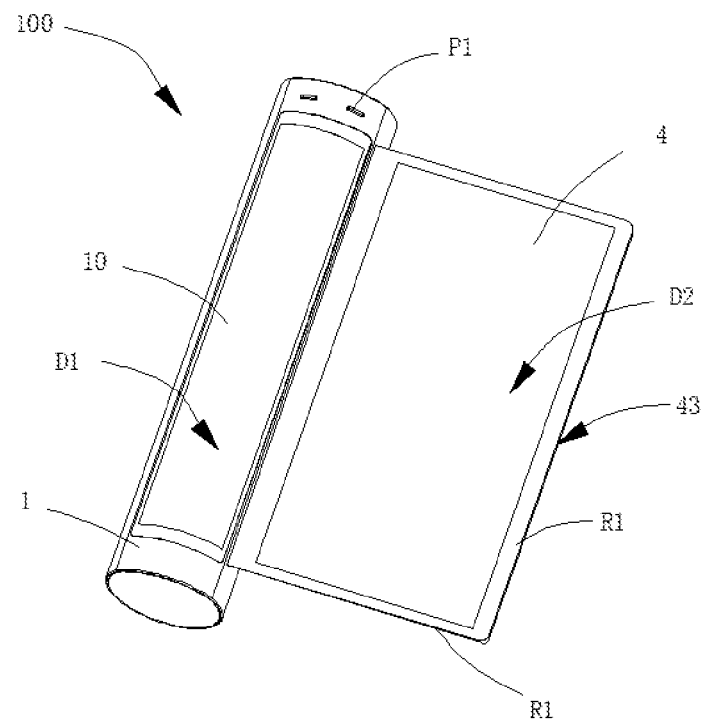
FIG. 3 is a schematic view illustrating the electronic device in a second state according to an embodiment of the present disclosure.

Referring to FIGS. 1-3, FIG. 1 is a block diagram illustrating an electronic device 100 according to an embodiment of the present disclosure. FIG. 2 is a schematic view illustrating the electronic device 100 in a first state. FIG. 3 is a schematic view illustrating the electronic device 100 in a second state. The electronic device 100 includes a housing 1, a rotatable mechanism 2, a driving mechanism 3, a flexible display screen 4, and a controller 5. The rotatable mechanism 2 and the driving mechanism 3 are received in the housing 1. The flexible display screen 4 is wound on and connected to the rotatable mechanism 2. The driving mechanism 3 is connected to the rotatable mechanism 2, and configured to rotate the rotatable mechanism 2. The controller 5 is electrically coupled to the driving mechanism 3. The controller 5 controls, in response to a corresponding control signal, the driving mechanism 3 to rotate the rotatable mechanism 2 in a corresponding direction to gradually wind the flexible display screen 4 and retract the flexible display screen 4 into the housing 1 or gradually stretch the flexible display screen 4 out of the housing 1 by rotation of the rotatable mechanism 2.

The housing 1 further has a light transmitting region 10. Part of the flexible display screen 4 facing the light transmitting region 10 forms a first display area D1 of the electronic device 100. When the flexible display screen 4 extends out of the housing 1, part of the flexible display screen 4 extending out of the housing 1 forms a second display area D2 of the electronic device 100. The controller 5 is further configured to control, according to a length of the part of the flexible display screen 4 extending out of the housing 1, display of the first display area D1 and the second display area D2 when the electronic device 100 implements display.

In an embodiment, the length of the part of the flexible display screen 4 extending out of the housing 1 may be detected by a distance sensor (not illustrated) disposed at a side of the flexible display screen that is first stretched out of the housing 1.

Accordingly, in the present disclosure, by setting the flexible display screen 4 that can be retracted into the housing 1 or stretched out of the housing 1, when it needs to implement large-screen display, as illustrated in FIG. 3, the flexible display screen 4 can be stretched out to implement the large-screen display. Thus, the electronic device 100 can be decreased in size, and user requirements for a large screen can be satisfied by the extendible flexible display screen 4. As illustrated in FIG. 2, when the flexible display screen 4 is received in the housing 1, it is easy to carry and hold the electronic device 100. Furthermore, in the present disclosure, according to the length of the part of the flexible display screen 4 extending out of the housing 1, the display of the first display area D1 and the second display area D2 are controlled, thereby diversifying display.

The first state mentioned above refers to a state in which the flexible display screen 4 is received in the housing 1 without any part extending out of the housing 1. The second state mentioned above refers to a state in which at least part of the flexible display screen 4 extends out of the housing 1.

Figure 6:
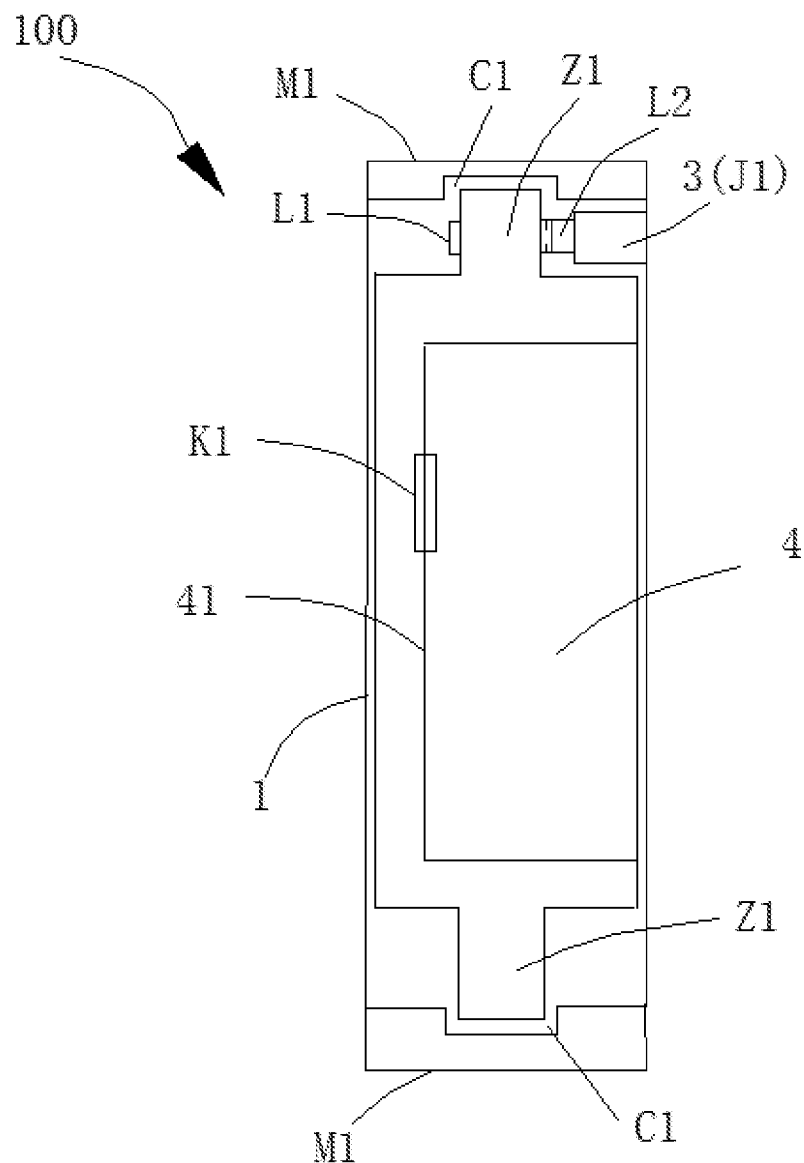
FIG. 6 is a sectional view of the electronic device according to another embodiment of the present disclosure.

As illustrated in FIG. 2, the housing 1 further defines an opening A1. The flexible display screen 4 has a first end 41 (as illustrated in FIG. 6) fixed to the rotatable mechanism 2, and an opposite second end 43 extending out of the opening A1. When the rotatable mechanism 2 is rotated, a tractive force from the second end 43 to the first end 41 is applied to the flexible display screen 4 to gradually wind the flexible display screen 4 and retract the flexible display screen 4 into the housing 1 by the rotation of the rotatable mechanism 2, or a thrust from the first end 41 to the second end 43 is applied to the flexible display screen 4 to gradually stretch the flexible display screen 4 out of the housing 1 by the rotation of the rotatable mechanism 2.

In some embodiments, when the electronic device 100 implements display, according to the length of the part of the flexible display screen 4 extending out of the housing 1, the controller 5 controls the display of the first display area D1 and the second display area 2 as follows. When the electronic device 100 implements display, the controller 5 enables, according to a variation of the length of the part of the flexible display screen 4 extending out of the housing 1, one of the first display area D1 and the second display area D1 to implement display. In alternative embodiments, the controller 5 displays, according to the variation of the length of the part of the flexible display screen 4 extending out of the housing 1, different contents on the first display area D1 and the second display area D2, respectively.

Accordingly, according to the variation of the length of the part of the flexible display screen 4 extending out of the housing 1, the controller 5 can enable merely one display area to implement display. In an alternative embodiment, according to the variation of the length of the part of the flexible display screen 4 extending out of the housing 1, the controller 5 can enable both the first display area D1 and the second display area D2 to implement display, and display different contents on the first display area D1 and the second display area D2, respectively.

The electronic device 100 implementing display refers to that the electronic device 100 enables the flexible display screen 4 and displays an image (images) on the flexible display screen 4.

In some embodiments, according to the variation of the length of the part of the flexible display screen 4 extending out of the housing 1, the controller 5 enables one of the first display area D1 and the second display area D2 to implement display as follows. When the length of the part of the flexible display screen 4 extending out of the housing 1 is smaller than a preset length, the first display area D1 is enabled to implement display, and the second display area D2 is not enabled to implement display. When the length of the part of the flexible display screen 4 extending out of the housing 1 is larger than or equals the preset length, the second display area D2 is enabled to implement display, and the first display area D1 is not enabled to implement display.

That is, when the length of the part of the flexible display screen 4 extending out of the housing 1 is smaller than the preset length, only the first display area D1 is enabled to implement display, and the second display area D2 is not enabled to implement display. When the length of the part of the flexible display screen 4 extending out of the housing 1 is larger than or equals the preset length, only the second display area D2 is enabled to implement display, and the first display area D1 is not enabled to implement display. Thus, display can be implemented through merely one display area, thereby reducing power consumption.

In some embodiments, according to the variation of the length of the part of the flexible display screen 4 extending out of the housing 1, the controller 5 displays different contents on the first display area D1 and the second display area D2 as follows. When the flexible display screen 4 is used for display and the length of the part of the flexible display screen 4 extending out of the housing 1 is smaller than the preset length, the controller 5 displays main contents on the first display area D1 and additional contents on the second display area D2. When the length of the part of the flexible display screen 4 extending out of the housing 1 is larger than or equals the preset length, the controller 5 displays the main contents on the second display area D2 and the additional contents on the first display area D1.

In some embodiments, when the electronic device 100 displays a literature work such as a poem and the like, the main contents are body contents of the literature work, and the additional contents are comments of the literature work. In an alternative embodiment, when the electronic device 100 displays an interface of playing a song, the main contents are lyrics of the song, and the additional contents are introduction of the song such as background of creation of the song, awards for the song, introduction of a singer of the song and the like. In an alternative embodiment, when the electronic device 100 displays a webpage containing texts and pictures, the main contents are the texts, and the additional contents are illustrations. In an alternative embodiment, when the electronic device 100 displays an interface of playing a video, the main contents are video content, and the additional contents are a brief introduction of the video, episode options and the like.

In some embodiments, the preset length equals a length of the light transmitting region 10 in a direction of movement of the flexible display screen 4. The length of the part of the flexible display screen 4 extending out of the housing 1 is the length of the part of the flexible display screen 4 extending out of the housing 1 in the direction of the movement of the flexible display screen 4.

In some embodiments, the light transmitting region 10 is a transparent cover plate G1 installed in a groove defined on a preset region of the housing 1.

In another embodiments, the light transmitting region 10 is a cover plate G2 installed in the groove defined on the preset region of the housing 1, where the cover plate G2 is transparent after being electrified. When the part of the flexible display screen 4 facing the preset region is used for display, the controller 5 is further configured to control electrification of the cover plate G2, such that the preset region becomes the light transmitting region 10, and the part of the flexible display screen 4 facing the light transmitting region 10 becomes visible.

Figure 4:
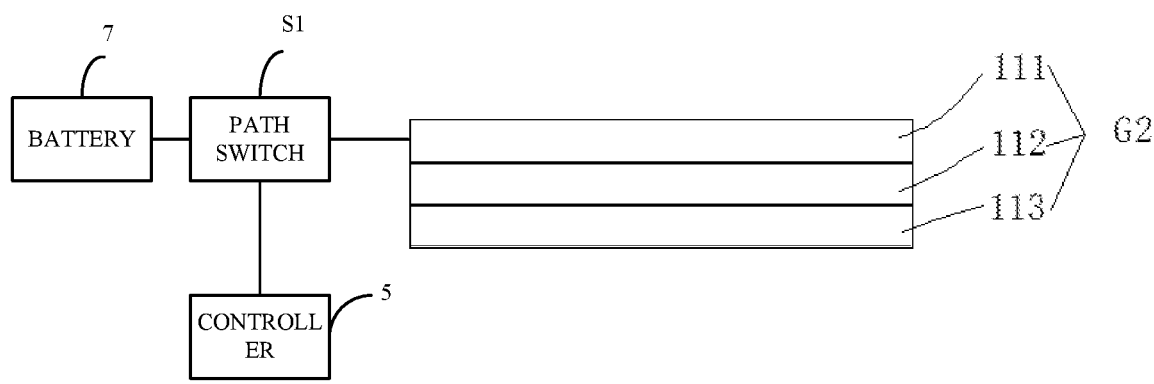
FIG. 4 is a structural view illustrating a cover plate according to an embodiment of the present disclosure, the cover plate being transparent after being electrified.

FIG. 4 is a structural view illustrating the cover plate G2 that is transparent after being electrified. As illustrated in FIG. 4, the cover plate G2 includes a driving electrode layer 111, a switch layer 112, and a common electrode layer 113 that are arranged in a stacked manner. The switch layer 112 is sandwiched between the driving electrode layer 111 and the common electrode layer 113.

The switch layer 112 is a liquid crystal molecule layer and includes multiple liquid crystal molecules. When a driving voltage is applied to the driving electrode layer 111, an electric potential difference is generated between the driving electrode layer 111 and the common electrode layer 113. According to characteristics of the liquid crystal molecules, the liquid crystal molecules of the switch layer 112 rotate simultaneously to be perpendicular to a light-out surface of the cover plate G2, such that lights can pass through the light-out surface to present a translucent effect. When no driving voltage is applied to the driving electrode layer 111, the liquid crystal molecules of the switch layer 112 are arranged in disorder, such that lights cannot pass through the light-out surface to present an opaque effect.

Figure 5:
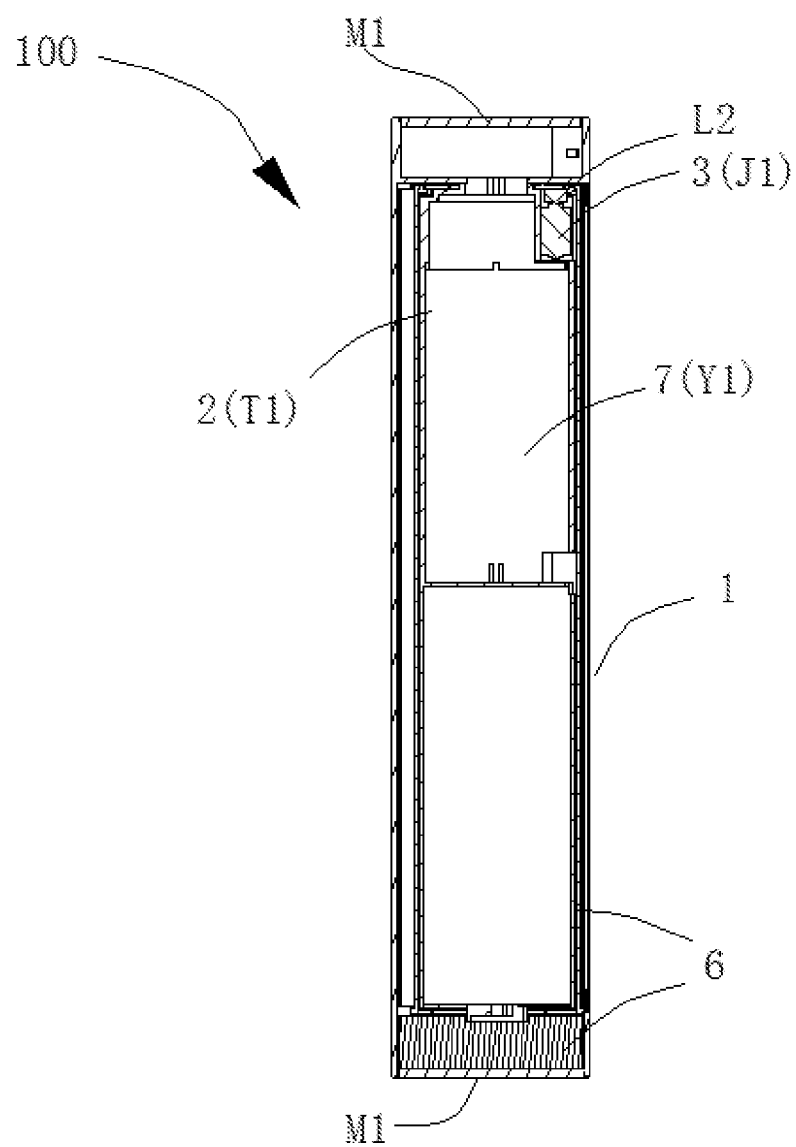
FIG. 5 is a sectional view of the electronic device according to an embodiment of the present disclosure.

FIG. 5 is a sectional view of the electronic device 100. As illustrated in FIG. 5, in some embodiments, the rotatable mechanism 2 is a drum T1. The drum T1 may be rotatably connected between two end surfaces M1 of the housing 1, where the end surfaces M1 are perpendicular to a longitudinal direction of the drum T1. The flexible display screen 4 is wound on and connected to an outer side of the drum T1. The driving mechanism 3 includes a motor J1. The motor J1 is connected to the drum T1 through gear engagement. The motor J1 rotates the drum T1 in different directions by changing rotation directions to gradually wind the flexible display screen 4 and retract the flexible display screen 4 into the housing 1 or gradually stretch the flexible display screen 4 out of the housing 1.

In some embodiments, as illustrated in FIG. 5, a bracket 6 reaching the two end surfaces M1 of the housing 1 is fixed to the two end surfaces M1. The drum T1 is rotatably connected to the bracket 6 and rotatably connected to the two end surfaces M1 through the bracket 6.

FIG. 6 is a sectional view of the electronic device 100 according to another embodiment. In some embodiments, the drum T1 has two ends facing the two end surfaces M1 of the housing 1, respectively, and each end forms a protruding post Z1. Each end surface M1 of the housing 1 defines a recess C1 on an inner side. The protruding posts Z1 of the drum T1 are rotatably received in the recesses C1 on the two end surfaces M1 of the housing 1, respectively.

As illustrated in FIG. 6, the protruding post Z1 has a length larger than a depth of the recess C1. Part of the protruding post Z1 exposed outside the recess C1 is provided with a gear L1 arranged circumferentially. The motor J1 is engaged with the gear L1 on the protruding post Z1 through a gear L2. Thus, when the motor J1 rotates the gear L2, the gear L2 rotates the engaged gear L1 on the protruding post Z1 to rotate the drum T1 around the protruding post Z1 received in the recess C1.

In some embodiments, the protruding posts Z1 are cylindrical, and the recesses C1 are cylindrical. An inner diameter of the recess C1 is slightly larger than an outer diameter of the protruding post Z1.

Referring to FIG. 5 again, as illustrated in FIG. 5, the drum T1 is hollow. The electronic device 100 further includes the bracket 6. The bracket 6 is arranged in the drum T1, and fixed to the end surface M1 of the housing 1, where the end surface M1 is perpendicular to the longitudinal direction of the drum T1. At least one component Y1 such as a battery 7 and the controller 5 are disposed on the bracket 6.

In some embodiments, the protruding post Z1 of the drum T1 defines an opening on a surface facing the recess C1. The bracket 6 has two ends, and the two ends reach the recesses C1 defined on the end surfaces M1 of the housing 1 through the protruding posts Z1 of the drum T1 and are fixed to bottom surfaces of the recesses C1, respectively.

As illustrated in FIG. 4, in some embodiments, when the light transmitting region 10 is the cover plate G2 that is installed in the groove defined on the preset region of the housing 1 and transparent after being electrified, the driving electrode layer 111 of the cover plate G2 is further electrically coupled to the battery 7 through a path switch S 1. The controller 5 is configured to switch on the path switch Si to apply the driving voltage to the driving electrode layer 111 through the battery 7, and to switch off the path switch Si to provide no driving voltage to the driving electrode layer 111.

As illustrated in FIG. 6, the driving mechanism 3 is fixed to the housing 1. Obviously, in another embodiments, the driving mechanism 3 may be fixed to the bracket 6. The gear L1 is circumferentially fixed to an inner surface of the protruding post Z1 of the drum T1. The driving mechanism 3 can be disposed on part of the bracket 6 that is received in the protruding post Z1. Similarly, by the engagement between the gear L2 and the gear L1, the driving mechanism 3 can be engaged with an inner side of the drum T1 through the gear engagement, and rotates the drum T1 through the gear engagement at the inner side.

As illustrated in FIG. 6, in some embodiments, the flexible display screen 4 includes a first end 41 fixed to the outer wall of the drum T1. The drum T1 defines an opening K1 at a portion connected to the flexible display screen 4. The first end 41 of the flexible display screen 4 is further electrically coupled to the component Y1 through the opening K1 defined on the drum T1 to realize power supply and display control of the flexible display screen 4, where the bracket 6 is accommodated in the drum T1, and the component Y1 is disposed on the bracket 6.

The first end 41 of the flexible display screen 4 is electrically coupled to the component Y1 through a flexible circuit board having a preset length or a cable having the preset length, where the bracket 6 is accommodated in the drum T1, and the component Y1 is disposed on the bracket 6. The flexible circuit board or cable having the preset length can maintain an electrical connection between the component Y1 disposed on the bracket 6 and the flexible display screen 4 during the rotation of the drum T1.

Referring to FIG. 3 again, in some embodiments, the flexible display screen 4 is provided with elastic sheets R1 at edges of the flexible display screen 4. When the flexible display screen 4 extends out of the housing 1, the elastic sheets R1 restore to flatten the flexible display screen 4.

The elastic sheet R1 is made of metal and straightened in a natural state. When the flexible display screen 4 is received in the housing 1, the elastic sheet R1 is rolled up. For example, the elastic sheet R1 may be made of copper, aluminum, or alloy material.

The flexible display screen 4 is rectangular. A side of the flexible display screen 4 that first extends out of the housing 1, and two sides of the flexible display screen 4 adjacent to the side of the flexible display screen 4 that first extends out of the housing 1 are provided with one elastic sheet R1. In another embodiments, four edges of the flexible display screen 4 are provided with one elastic sheet R1.

In some embodiments, the flexible display screen 4 is a flexible touch display screen. When the flexible display screen 4 extends out of the housing 1, the flexible display screen 4 can generate a corresponding touch signal in response to user touch. The controller 5 can further receive the touch signal and execute a corresponding function.

As illustrated in FIG. 2 and FIG. 3, the housing 1 is further provided with a number of input elements P1. Each input element P1 is configured to allow a user to perform an operation on an object such as an icon, an item or the like displayed on the part of the flexible display screen 4 facing the light transmitting region 10.

In some embodiments, the input elements P1 include a number of sensors, a receiver, a camera, a mechanical button, a touch pad, and the like, and are configured to sense user action, user voice, touch input, and the like.

In some embodiments, the control signal is generated in response to an input operation. The input operation at least includes a voice input operation, an operation on a button, and a touch gesture. The control signal may be a control signal for retracting or a control signal for stretching. The controller 5 controls, in response to the control signal for retracting, the driving mechanism 3 to rotate the rotatable mechanism 2 to gradually retract the flexible display screen 4 into the housing 1, and controls, in response to the control signal for stretching, the driving mechanism 3 to rotate the rotatable mechanism 2 to gradually stretch the flexible display screen 4 out of the housing 1.

In some embodiments, the input elements P1 further include a first driving triggering button and a second driving triggering button. The controller 5 controls, in response to the control signal for retracting generated by the first driving triggering button, the driving mechanism 3 to rotate the rotatable mechanism 2 to gradually retract the flexible display screen 4 into the housing 1, and controls, in response to the control signal for stretching, the driving mechanism 3 to rotate the rotatable mechanism 2 to gradually stretch the flexible display screen 4 out of the housing 1.

In some embodiments, the control signal for retracting can also be generated in response to a voice command such as "retracting" or the like, and the controller 5 controls, in response to the control signal for retracting, the driving mechanism 3 to rotate the rotatable mechanism 2 to gradually retract the flexible display screen 4 into the housing 1. The control signal for stretching can also be generated in response to a voice command such as "stretching" or the like, and the controller 5 controls, in response to the control signal for stretching, the driving mechanism 3 to rotate the rotatable mechanism 2 to gradually stretch the flexible display screen 4 out of the housing 1.

In some embodiments, the corresponding control signal can also be generated in response to a particular touch gesture on the touch pad, and the control 5 controls, in response to the corresponding control signal, the driving mechanism 3 to rotate the rotatable mechanism 2 to gradually retract the flexible display screen 4 into the housing 1 or gradually stretch the flexible display screen 4 out of the housing 1. For example, the control signal for retracting is generated in response to sliding to the left on the touch pad, and the control signal for stretching is generated in response to sliding to the right on the touch pad.

FIG. 7 is a sectional view of the electronic device 100, taken along the direction of the movement of the flexible display screen 4. As illustrated in FIG. 7, the flexible display screen 4 has a second end 43 provided with a block sheet 45. After the flexible display screen 4 is fully received in the housing 1, the block sheet 45 prevents the flexible display screen 4 from being further wound and retracted into the housing 1.

In some embodiments, the block sheet 45 can be engaged with the housing 1, such that when the block sheet 45 resists against an outer surface of the housing 1 following winding the flexible display screen 4 and retracting the flexible display screen 4 into the housing 1, the block sheet 45 is engaged with the housing 1, and thus the flexible display screen 4 is prevented from extending out of the opening A1 without an external force.

In some embodiments, the block sheet 45 can be magnetically engaged with the housing 1. For example, the block sheet 45 is made from magnetic material, and the housing 1 is made of metal material. When the block sheet 45 gets close to and resists against the housing 1 following retracting the flexible display screen 4 into the housing 1 gradually, the block sheet 45 is magnetically engaged with the housing 1. In some embodiments, the block sheet 45 is engaged with the housing 1 through buckle structures that match with each other.

When a force that stretches the flexible display screen 4 out of the housing 1 reaches a certain degree following the rotation of the rotatable mechanism 2 driven by the driving mechanism 3, a force generated due to the engagement between the block sheet 45 and the housing 1 can be overcome to stretch the flexible display screen 4 out of the housing 1.

In some embodiments, the controller 5 is further configured to control the driving mechanism 3 to rotate the rotatable mechanism 2 to gradually retract the flexible display screen 4 into the housing 1 until the block sheet 45 is engaged with the housing 1, and then the controller 5 further controls the driving mechanism 3 to rotate the rotatable mechanism 2 a certain distance in an opposite direction to generate a force for stretching the flexible display screen 4 out of the housing 1. The force cannot overcome the force generated due to the engagement between the block sheet 45 and the housing 1, but can raise up part of the flexible display screen 4 adjacent to the block sheet 45 to get further close to an inner surface of the light transmitting region 10 of the housing 1, such that a relative distance between the light transmitting region 10 and the flexible display screen 4 is reduced, thereby improving an effect of viewing the flexible display screen 4 through the light transmitting region 10.

As illustrated in FIG. 2 and FIG. 3, the housing 1 is cylindrical.

The controller 5 may be a central processing unit, a single chip, a digital signal processor, or the like.

The electronic device 100 may be a smart terminal having a photographing function, a phone function, an internet function, and the like.

FIG. 8 is a flow chart illustrating a method for controlling display according to an embodiment of the present disclosure. The method is applied to the electronic device 100 mentioned above. The electronic device 100 includes the housing 1, the rotatable mechanism 2, the driving mechanism 3, and the flexible display screen 4. The rotatable mechanism 2 and the driving mechanism 3 are received in the housing 1. The flexible display screen 4 is wound on and connected to the rotatable mechanism 2. The housing 1 has a light transmitting region 10. The part of the flexible display screen 4 facing the light transmitting region 10 forms the first display area D1 of the electronic device 100. As illustrated in FIG. 8, the method for controlling display includes the following.

At block 81, in response to the control signal for retracting, the driving mechanism 3 is controlled to rotate the rotatable mechanism 2 in a first direction to retract the flexible display screen 4 into the housing 1, and in response to the control signal for stretching, the driving mechanism 3 is controlled to rotate the rotatable mechanism 2 in a second direction opposite the first direction to stretch the flexible display screen 4 out of the housing 1. The control signal for retracting and the control signal for stretching may be generated in response to different input operations. The different input operations at least include different voice input operations, different operations on a button, and different touch gestures.

At block 83, according to the length of the part of the flexible display screen 4 extending out of the housing 1, the display of the first display area D1 and the second display area D2 of the flexible display screen 4 extending out of the housing 1 are controlled.

In some embodiments, the operation at block 83 can include the following. When the electronic device 100 implements display, according to the variation of the length of the part of the flexible display screen 4 extending out of the housing 1, one of the first display area D1 and the second display area D2 are enabled to implement display. In an alternative embodiment, according to the variation of the length of the part of the flexible display screen 4 extending out of the housing 1, different contents are displayed on the first display area D1 and the second display area D2, respectively.

The electronic device 100 implementing display refers to that the electronic device 100 enables the flexible display screen 4 and displays an image (images) on the flexible display screen 4.

In some embodiments, according to the variation of the length of the part of the flexible display screen 4 extending out of the housing 1, one of the first display area D1 and the second display area D2 is enabled to implement display as follows. When the length of the part of the flexible display screen 4 extending out of the housing 1 is smaller than a preset length, the first display area D1 is enabled to implement display, and the second display area D2 is not enabled to implement display. When the length of the part of the flexible display screen 4 extending out of the housing 1 is larger than or equals the preset length, the second display area D2 is enabled to implement display, and the first display area D1 is not enabled to implement display.

In some embodiments, according to the variation of the length of the part of the flexible display screen 4 extending out of the housing 1, different contents are displayed on the first display area D1 and the second display area D2 as follows. When the flexible display screen 4 implements display and the length of the part of the flexible display screen 4 extending out of the housing 1 is smaller than the preset length, main contents are displayed on the first display area D1, and additional contents are displayed on the second display area D2. When the length of the part of the flexible display screen 4 extending out of the housing 1 is larger than or equals the preset length, the main contents are displayed on the second display area D2, and the additional contents are displayed on the first display area D1.

In some embodiments, when the electronic device 100 displays a literature work such as a poem and the like, the main contents are body contents of the literature work, and the additional contents are comments of the literature work. In an alternative embodiment, when the electronic device 100 displays an interface of playing a song, the main contents are lyrics of the song, and the additional contents are introduction of the song such as background of creation of the song, awards for the song, introduction of a singer of the song and the like. In an alternative embodiment, when the electronic device 100 displays a webpage containing texts and pictures, the main contents are the texts, and the additional contents are illustrations. In an alternative embodiment, when the electronic device 100 displays an interface of playing a video, the main contents are video content, and the additional contents are a brief introduction of the video, episode options and the like.

In some embodiments, the preset length equals the length of the light transmitting region 10 in the direction of the movement of the flexible display screen 4.

For the method, reference may be made to functions of the electronic device 100. Functional steps executed by the electronic device 100 may be corresponding steps of the method.

For the electronic device 100 and the method provided in the embodiments of the present disclosure, by setting the flexible display screen 4 that can be retracted into or stretched out of the housing 1, when a large-screen display is needed, the flexible display screen 4 can be stretched out to implement the large-screen display, and thus the electronic device 100 may be decreased in size, and user requirements for a large screen can be satisfied through the extendible flexible display screen 4. When the flexible display screen 4 is received in the electronic device 100, it is easy to carry and hold the electronic device 100. Furthermore, in the present disclosure, according to the length of the part of the flexible display screen 4 extending out of the housing 1, display of the first display area D1 and the second display area D1 are controlled, thereby diversifying display.

The method provided in the present disclosure may be implemented by hardware or firmware, or may be acted as software or computer codes stored in a computer readable storage medium such as a compact disc (CD), a read-only memory (ROM), a random access memory (RAM), a software disc, a hardware disc, an optical disc or the like, or computer codes that are downloaded to a local record medium from a remote record medium or a non-volatile machine-readable medium through network. Thus, the method described herein may be in the form of a software stored in a record medium of a general computer, a special processor, or a programmable or special hardware such as an application specific integrated circuit (ASIC), a field programmable gate array (FPGA) or the like. As understood by a person skilled in the art, the computer, the processor, a microprocessor, a controller or a programmable hardware includes a memory assembly such as a RAM, ROM, a flash memory or the like. When the computer, the processor, or the hardware executes the processing method described herein to access and execute software or computer codes, the memory assembly can store or receive the software or computer codes. In additional, when the general computer accesses the codes for executing the processing method, the general computer is converted into a special computer through the execution of the codes to execute the processing method.

The computer readable storage medium may be a solid memory, a memory card, a disc, or the like. The computer readable storage medium stores program instructions to be invoked by the computer to execute the method as illustrated in FIG. 8.

The above are embodiments of the present disclosure. It should be pointed out that for a ordinary person skilled in the art, several modifications and polishes may be made without departing from the principle of the embodiments of the present disclosure. These modifications and polishes are also deemed to be the protection scope of the present disclosure.

What is claimed is:

1. An electronic device comprising:
a housing;
a rotatable mechanism received in the housing;
a driving mechanism received in the housing, and connected to the rotatable mechanism to rotate the rotatable mechanism;
a flexible display screen wound on and connected to the rotatable mechanism; and
a controller electrically coupled to the driving mechanism, and configured to control, in response to a control signal for retracting, the driving mechanism to rotate the rotatable mechanism in a first direction to retract the flexible display screen into the housing, and to control, in response to a control signal for stretching, the driving mechanism to rotate the rotatable mechanism in a second direction opposite the first direction to stretch the flexible display screen out of the housing;
the housing having a light transmitting region;
part of the flexible display screen facing the light transmitting region forming a first display area of the electronic device;
part of the flexible display screen extending out of the housing forming a second display area of the electronic device;
the controller being further configured to control, according to a length of the part of the flexible display screen extending out of the housing, display of the first display area and the second display area;
the light transmitting region being a cover plate that is installed in a groove defined on a preset region of the housing and transparent after being electrified; and
the controller being further configured to control, when the part of the flexible display screen facing the preset region is used to implement display, electrification of the preset region to cause the preset region to be the light transmitting region, so as to cause the part of the flexible display screen facing the preset region to be visible.

2. The electronic device of claim 1, wherein the controller is configured to enable, according to a variation of the length of the part of the flexible display screen extending out of the housing, one of the first display area and the second display area to implement display.

3. The electronic device of claim 2, wherein the controller is configured to enable the first display area to implement display when the length of the part of the flexible display screen extending out of the housing is smaller than a preset length, and to enable the second display area to implement display when the length of the part of the flexible display screen extending out of the housing is larger than or equals the preset length.

4. The electronic device of claim 1, wherein the controller is configured to display, according to a variation of the length of the part of the flexible display screen extending out of the housing, different contents on the first display area and the second display area, respectively.

5. The electronic device of claim 4, wherein the controller is configured to display, when the length of the part of the flexible display screen extending out of the housing is smaller than a preset length, main contents on the first display area and additional contents on the second display area, and to display, when the length of the part of the flexible display screen extending out of the housing is larger than or equals the preset length, the main contents on the second display area and the additional contents on the first display area.

6. The electronic device of claim 5, wherein:
when the electronic device displays a literature work, the main contents are body contents of the literature work, and the additional contents are comments of the literature work; and
when the electronic device displays an interface of playing a song, the main contents are lyrics of the song, and the additional contents are introduction of the song.

7. The electronic device of claim 1, wherein the rotatable mechanism is a drum rotatably connected to an end surface of the housing, wherein the end surface is perpendicular to a longitudinal direction of the drum;
the flexible display screen is wound on and connected to an outer wall of the drum; and
the driving mechanism comprises a motor connected to the drum through gear engagement, wherein the motor is configured to rotate the drum in different directions by changing rotation directions to gradually wind the flexible display screen and retract the flexible display screen into the housing or gradually stretch the flexible display screen out of the housing.

8. The electronic device of claim 7, wherein the drum is hollow, and the electronic device further comprises a bracket disposed in the drum and fixed to the end surface of the housing, wherein at least one component is disposed on the bracket, wherein the at least one component at least comprises a battery and the controller.

9. The electronic device of claim 8, wherein the flexible display screen has a first end fixed to the drum, wherein the first end of the flexible display screen is further electrically coupled to the at least one component through an opening defined on the drum to realize power supply and display control of the flexible display screen.

10. The electronic device of claim 9, wherein the first end of the flexible display screen is electrically coupled to the at least one component through a flexible circuit board having a preset length or a cable having the preset length, wherein the flexible circuit board or the cable having the preset length is able to maintain an electrical connection between the at least one component disposed on the bracket and the flexible display screen during the rotation of the drum.

11. The electronic device of claim 1, wherein the flexible display screen is provided with an elastic sheet at an edge of the flexible display screen, wherein the elastic sheet at the edge of the flexible display screen restores to flatten the flexible display screen when the flexible display screen extends out of the housing.

12. The electronic device of claim 11, wherein the elastic sheet is made of metal, and straightened in a natural state.

13. The electronic device of claim 1, wherein the housing is cylindrical.

14. The electronic device of claim 1, wherein the control signal for retracting and the control signal for stretching are generated in response to different input operations.

15. An electronic device comprising:
a housing having a light transmitting region;
a rotatable mechanism received in the housing;
a driving mechanism received in the housing, and connected to the rotatable mechanism to rotate the rotatable mechanism;
a flexible display screen wound on and connected to the rotatable mechanism, part of the flexible display screen facing the light transmitting region forming a first display area of the electronic device, and part of the flexible display screen extending out of the housing forming a second display area of the electronic device; and
a controller electrically coupled to the driving mechanism, and configured to:
control, in response to a control signal for retracting, the driving mechanism to rotate the rotatable mechanism in a first direction to retract the flexible display screen into the housing;
control, in response to a control signal for stretching, the driving mechanism to rotate the rotatable mechanism in a second direction to stretch the flexible display screen out of the housing; and
display, when a length of the part of the flexible display screen extending out of the housing is smaller than a preset length, main contents on the first display area and additional contents on the second display area, and display, when the length of the part of the flexible display screen extending out of the housing is larger than or equals the preset length, the main contents on the second display area and the additional contents on the first display area.

16. A method for controlling display of an electronic device, the method comprising:
controlling, in response to a control signal for retracting, a driving mechanism of the electronic device to rotate a rotatable mechanism of the electronic device in a first direction to retract a flexible display screen of the electronic device into a housing of the electronic device, and controlling, in response to a control signal for stretching, the driving mechanism to rotate the rotatable mechanism in a second direction opposite the first direction to stretch the flexible display screen out of the housing; and
displaying, when a length of part of the flexible display screen extending out of the housing is smaller than a preset length, main contents on first part of the flexible display screen and additional contents on second part of the flexible display screen, and displaying, when the length of the part of the flexible display screen extending out of the housing is larger than or equals the preset length, the main contents on the second part and the additional contents on the first part, the first part facing a light transmitting region of the housing, and the second part being part of the flexible display screen extending out of the housing.

* * * * *